(12) United States Patent
Yu et al.

(10) Patent No.: US 8,294,041 B2
(45) Date of Patent: Oct. 23, 2012

(54) CIRCUIT BOARD AND MANUFACTURING METHOD THEREOF

(75) Inventors: Cheng-Po Yu, Taoyuan County (TW); Cheng-Hung Yu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 395 days.

(21) Appl. No.: 12/170,082

(22) Filed: Jul. 9, 2008

(65) Prior Publication Data

US 2009/0250247 A1   Oct. 8, 2009

(30) Foreign Application Priority Data

Apr. 7, 2008   (TW) .............................. 97112489 A

(51) Int. Cl.
*H05K 1/11* (2006.01)
(52) U.S. Cl. ................... 174/262; 174/266; 174/267
(58) Field of Classification Search ................ 174/262, 174/266, 267, 250
See application file for complete search history.

(56) References Cited

U.S. PATENT DOCUMENTS

| 4,936,950 | A | 6/1990 | Doan et al. |
| 5,486,234 | A | 1/1996 | Contolini et al. |
| 6,388,198 | B1 * | 5/2002 | Bertin et al. ................ 174/251 |
| 6,569,757 | B1 * | 5/2003 | Weling et al. ............... 438/618 |
| 2007/0199736 | A1 * | 8/2007 | Wang .......................... 174/266 |
| 2008/0169568 | A1 * | 7/2008 | Kotake et al. ............... 257/773 |
| 2009/0015266 | A1 * | 1/2009 | Narita et al. ................ 324/603 |

* cited by examiner

*Primary Examiner* — Yuriy Semenenko
*Assistant Examiner* — Andargie M Aychillhum
(74) *Attorney, Agent, or Firm* — J.C. Patents

(57) ABSTRACT

A circuit board including a first dielectric layer having a first surface and a second surface, a first circuit layer, a second dielectric layer, and a second circuit layer is provided. At least one trench is formed on the first surface, and the first circuit layer is formed on an inside wall of the trench. In addition, the second dielectric layer is disposed in the trench, and covers the first circuit layer. The second circuit layer is disposed in the trench, and the second dielectric layer is located between the first circuit layer and the second circuit layer. A manufacturing method of the circuit board is further provided.

3 Claims, 7 Drawing Sheets

CIRCUIT BOARD AND MANUFACTURING METHOD THEREOF

CROSS-REFERENCE TO RELATED APPLICATION

This application claims the priority benefit of Taiwan application serial no. 97112489, filed on Apr. 7, 2008. The entirety of the above-mentioned patent application is hereby incorporated by reference herein and made a part of this specification.

BACKGROUND OF THE INVENTION

1. Field of the Invention

The present invention generally relates to a circuit board and manufacturing method thereof, in particular, to a circuit board having electromagnetic shielding effect and a manufacturing method thereof.

2. Description of Related Art

Generally speaking, a circuit board for carrying or electrically connecting a plurality of electronic components is formed by alternately stacking a plurality of patterned conductive layers and a plurality of dielectric layers. The patterned circuit layers are defined by the copper foil after performing a photolithographic process. The dielectric layers are respectively disposed between two adjacent patterned circuit layers, for isolating the patterned circuit layers. Moreover, various electronic components (e.g. active or passive components) may be disposed on the surface of the circuit board, and circuit layers of the circuit board may be used to achieve the purpose of electrical signal propagation. However, since the technical requirement of the signal propagation frequency transmitting by the circuit layers becomes increasingly high, the electromagnetic interference and noises between any two circuit layers gradually aggravates.

SUMMARY OF THE INVENTION

The present invention is directed to a circuit board and manufacturing method thereof, so as to achieve good signal propagation in the internal circuits of the circuit board.

The present invention provides a circuit board including a first dielectric layer having a first surface and a second surface, a first circuit layer, a second dielectric layer, and a second circuit layer. At least one first trench is formed on the first surface. The first circuit layer is formed on an inside wall of the first trench. In addition, the second dielectric layer is disposed in the first trench, and covers the first circuit layer. The second circuit layer is disposed in the first trench, and the second dielectric layer is located between the first circuit layer and the second circuit layer.

In an embodiment of the present invention, the circuit board further includes a third dielectric layer, a first connection circuit, a second connection circuit, and a first conductive hole. The first conductive hole is formed in first dielectric layer. The first connection circuit is disposed on the second surface and is connected with the first conductive hole. The third dielectric layer is disposed on the first surface, and has a second conductive hole connected with the second circuit layer. The second connection circuit is disposed on the third dielectric layer and is connected with the second conductive hole.

In an embodiment of the present invention, a material of the second dielectric layer is a high dielectric constant material.

The present invention further provides a manufacturing method of a circuit board, which includes the following steps. First, a first dielectric layer having a first surface and a second surface is provided. Then, at least one first trench is formed on the first surface. After that, a first circuit layer is formed on an inside wall of the first trench. Thereafter, a second dielectric layer is formed on the first circuit layer. Then, a second circuit layer is formed in the second dielectric layer, and the second dielectric layer is located between the first circuit layer and the second circuit layer.

In an embodiment of the present invention, after forming the second circuit layer in second dielectric layer, the method further includes the following steps. First, a first conductive hole is formed in the first dielectric layer, and the first conductive hole is connected with first circuit layer. Then, a first connection circuit is formed on the second surface, and the first connection circuit is connected with the first conductive hole. After that, a third dielectric layer is formed on the first surface. After that, a second conductive hole is formed in the third dielectric layer, and the second conductive hole is connected with the second circuit layer. Then, a second connection circuit is formed on the third dielectric layer, and the second connection circuit is connected with the second conductive hole.

In an embodiment of the present invention, after the second dielectric layer is formed on the first circuit layer, the method further includes forming a second trench in second dielectric layer, and the second circuit layer is located in the second trench.

In an embodiment of the present invention, the process of forming the second dielectric layer includes conformably forming the second dielectric layer on the first circuit layer, so as to make the second dielectric layer have a second trench.

In the present invention, the second circuit layer is, for example, a main circuit for transmitting electrical signals, and the first circuit layer is, for example, a shielding circuit. Therefore, when the electrical signals propagate on the main circuit, the shielding circuit may exert the shielding function, for effectively alleviating the electromagnetic interference between the main circuits, and thus the main circuits have a good signal transmission quality.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
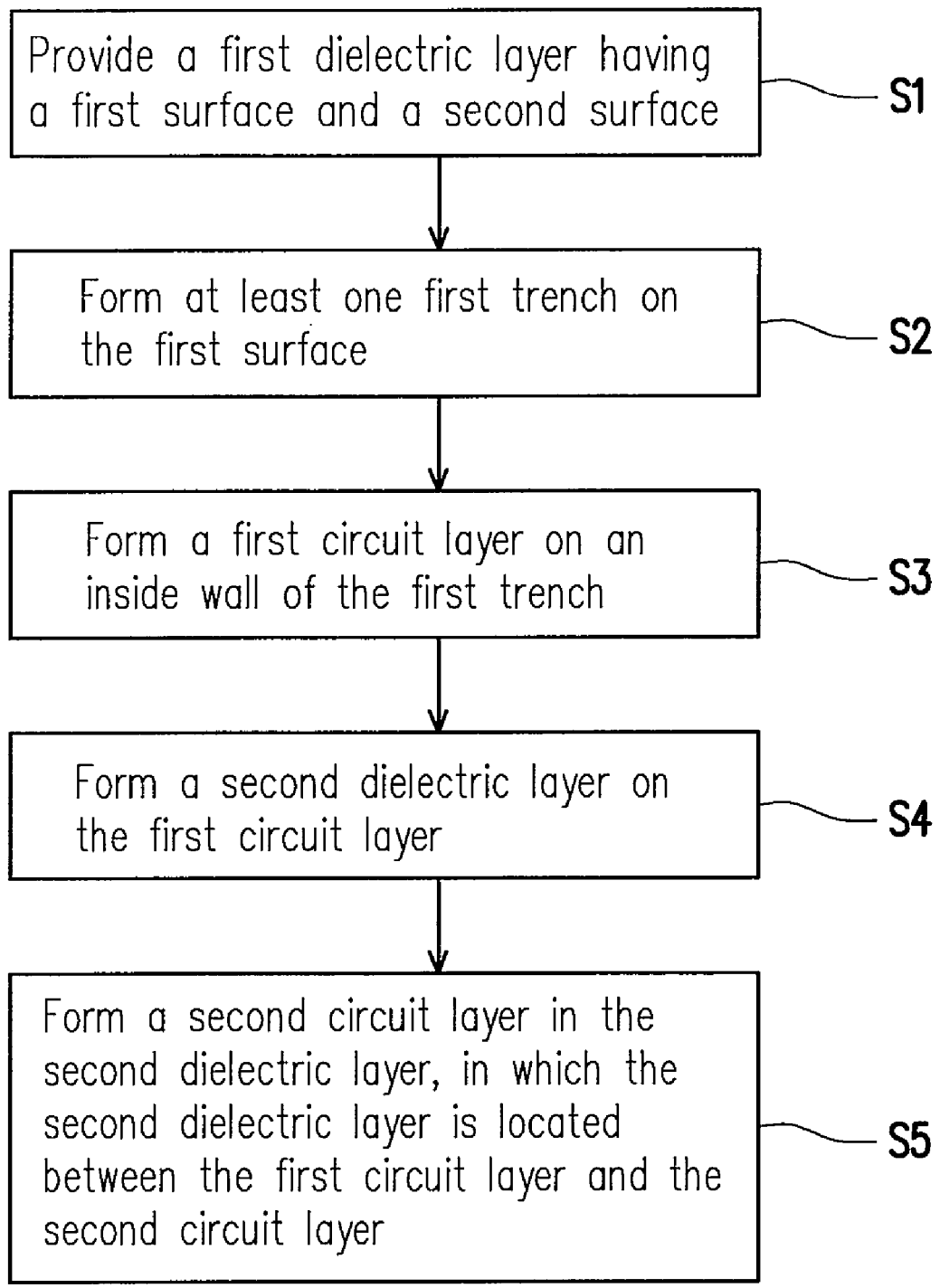
FIG. 1 is a schematic view of processes of manufacturing a circuit board according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic view of processes of manufacturing a circuit board according to an embodiment of the present invention. Referring to FIG. 1, in this embodiment, the manufacturing method of a circuit board includes the following steps. First, in Step S1, a first dielectric layer having a first surface and a second surface is provided. Then, in Step S2, at least one first trench is formed on the first surface. After that, in Step S3, a first circuit layer is formed on an inside wall of the first trench. Thereafter, in Step S4, a second dielectric layer is formed on first circuit layer. Then, in Step S5, a second circuit layer is formed in second dielectric layer. The second dielectric layer is located between the first circuit layer and the second circuit layer.

For making the manufacturing method of a circuit board of the embodiment more apparent, the embodiment will be illustrated with reference to the detailed cross-sectional process view.

Figure 2A:
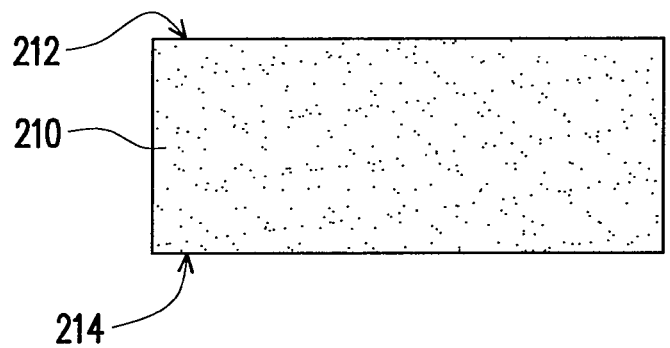
FIGS. 2A to 2F are cross-sectional view of processes of manufacturing a circuit board according to an embodiment of the present invention.
Figure 2B:
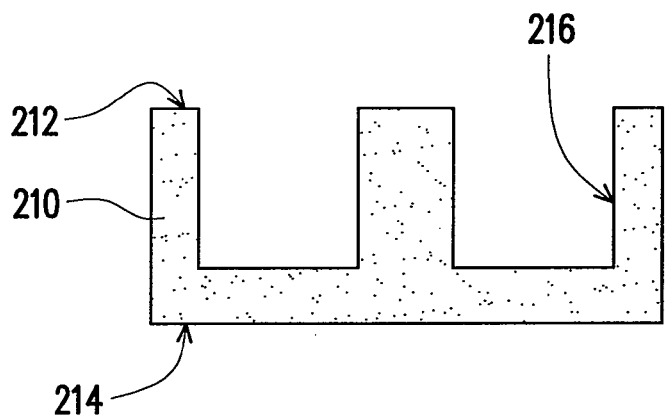
Figure 2C:
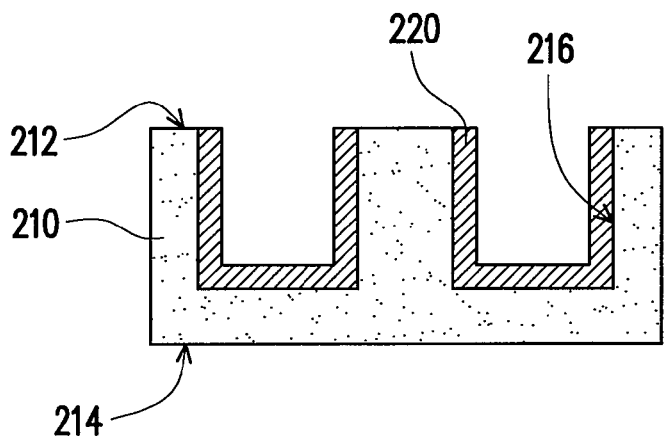

FIGS. 2A to 2F are cross-sectional view of processes of manufacturing a circuit board according to an embodiment of the present invention. First, as shown in FIG. 2A, a first dielectric layer 210 having a first surface 212 and a second surface 214 is provided. After that, as shown in FIG. 2B, at least one first trench 216 (e.g. two in this embodiment) is formed on the first surface 212. The first trench 216 may be formed by mechanical drilling, mechanical grooving, laser drilling, laser ablation, or the like. After that, as shown in 2C, a first circuit layer 220 is formed on the inside wall of each first trench 216. The first circuit layer 220 is, for example, formed by electroplating, chemical deposition, or the like.

Figure 2D:
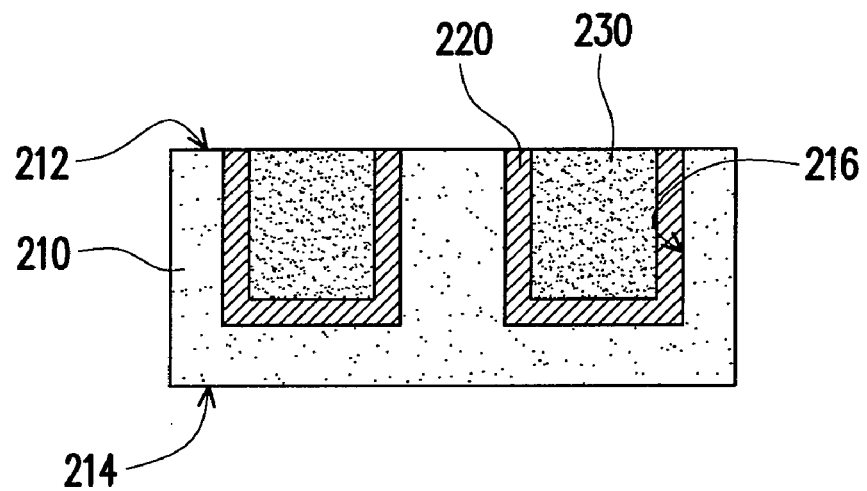
Figure 2E:
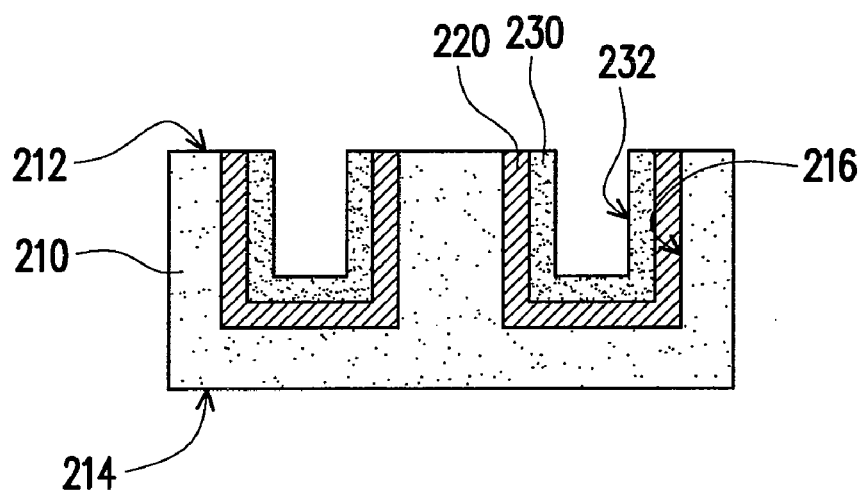
Figure 2F:
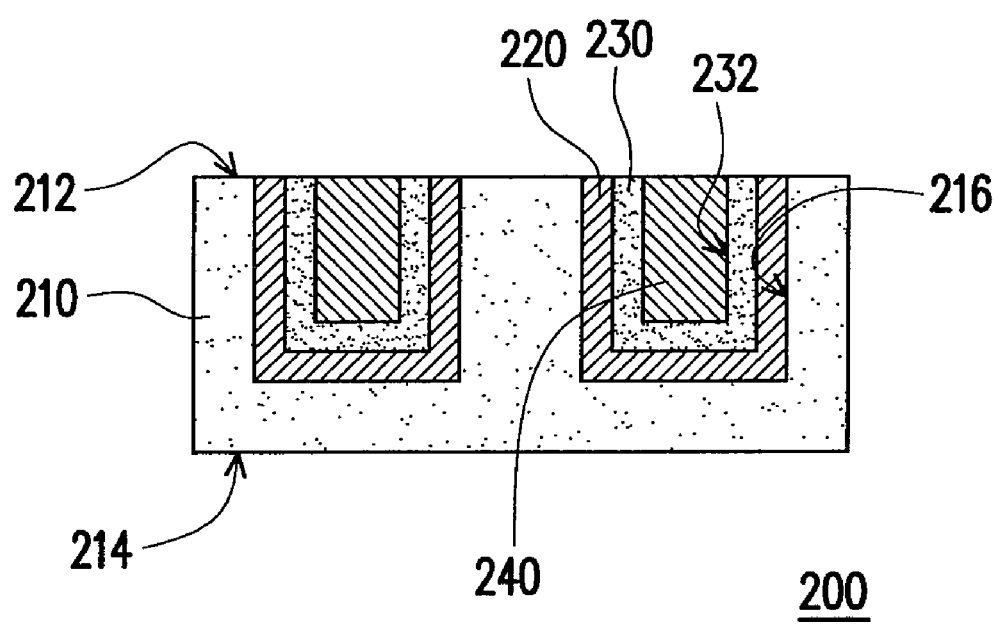

After a first circuit layer 220 is formed, as shown in FIGS. 2D to 2E, a second dielectric layer 230 is formed on the first circuit layer 220, and covers the first circuit layer 220. Then, as shown in FIG. 2F, a second circuit layer 240 is formed in the second dielectric layer 230. Hence, the manufacturing of the circuit board 200 is completed. Likewise, the second circuit layer 240 is formed by electroplating, chemical deposition, or the like. In this embodiment, the second dielectric layer 230 is located between the first circuit layer 220 and the second circuit layer 240.

Accordingly, in this embodiment, for example, the second dielectric layer 230 is filled in the first trench 216 to cover the first circuit layer 220 (referring to FIG. 2D). Then, a second trench 232 is formed in second dielectric layer 230 by mechanical drilling, laser drilling, or the like (referring to FIG. 2E). The second circuit layer 240 of this embodiment is formed in the second trench 232 (referring to FIG. 2F). In this embodiment, the second dielectric layer 230 is filled in the first trench 216, and then a space is formed in the second dielectric layer 230 for disposing the second circuit layer 240 in an appropriate manner. However, in other embodiments, after the first circuit layer 220 is formed on the inside wall of the first trench 216, the second dielectric layer 230 may be conformably formed on the first circuit layer 220 by coating or in other appropriate manner (the second dielectric layer 230 does not fill up the first trench 216), such that the second dielectric layer 230 is provided with a second trench 232 for disposing the second circuit layer 240.

Referring to FIG. 2F, in this embodiment, the second circuit layer 240 is, for example, a main circuit for transmitting electrical signals, and the first circuit layer 220 is, for example, a shielding circuit. The material of the second dielectric layer 230 is, for example, a high dielectric constant material. In this manner, when the electrical signals propagate on the main circuit, the shielding circuit exerts the shielding function. That is to say, when the electrical signals propagate on, for example, the second circuit layer 240 of the main circuit, for example, the first circuit layer 220 of the shielding circuit effectively protects the second circuit layer 240 from electromagnetic interference generated by adjacent circuits. Thus, the second circuit layer 240 has good signal transmission quality.

Figure 3A:
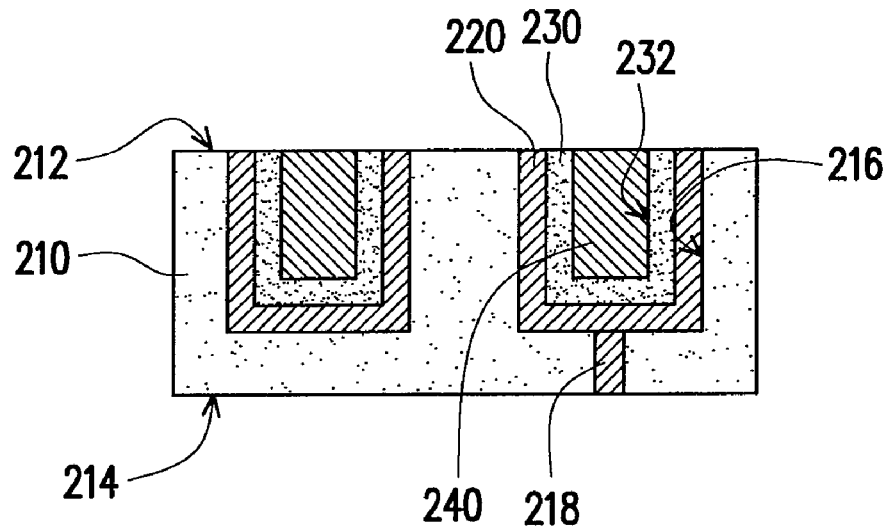
FIGS. 3A to 3E are cross-sectional view of processes of manufacturing a circuit board according to another embodiment of the present invention.
Figure 3B:
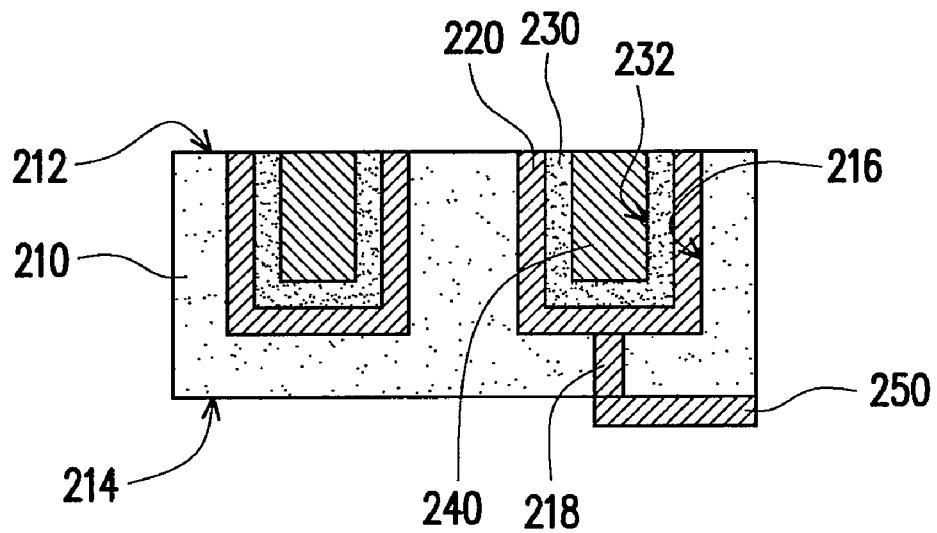
Figure 3C:
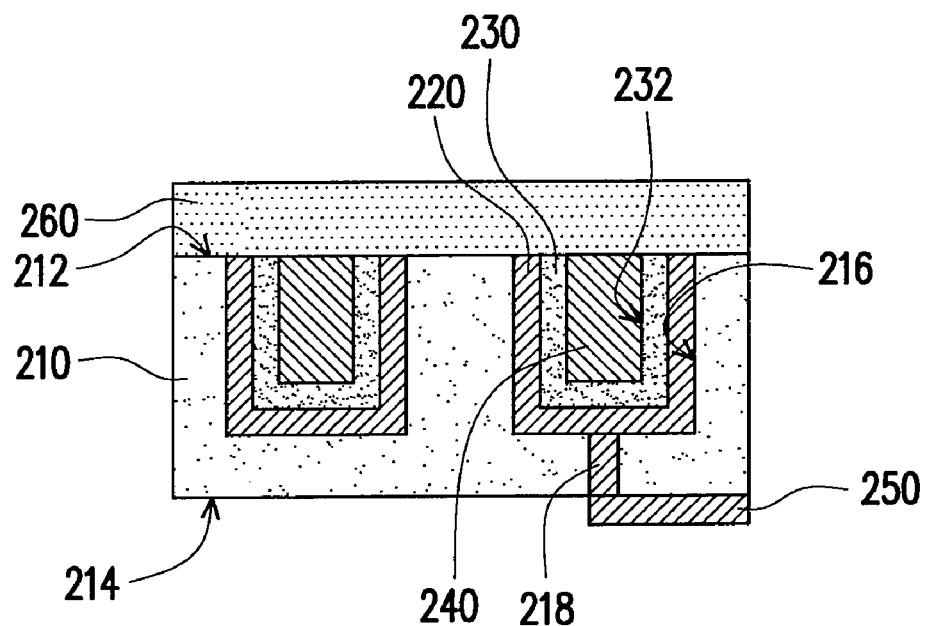
Figure 3D:
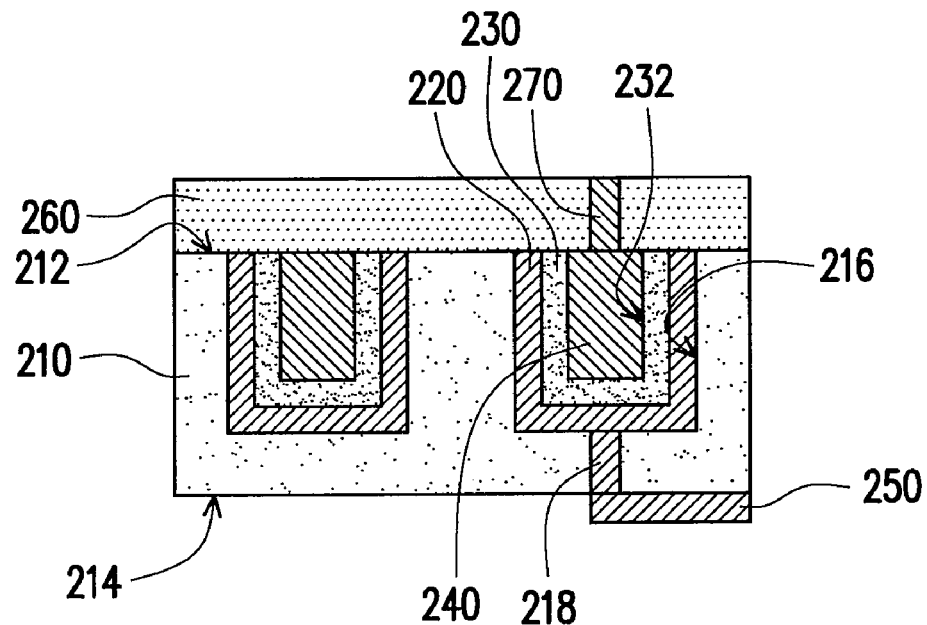
Figure 3E:
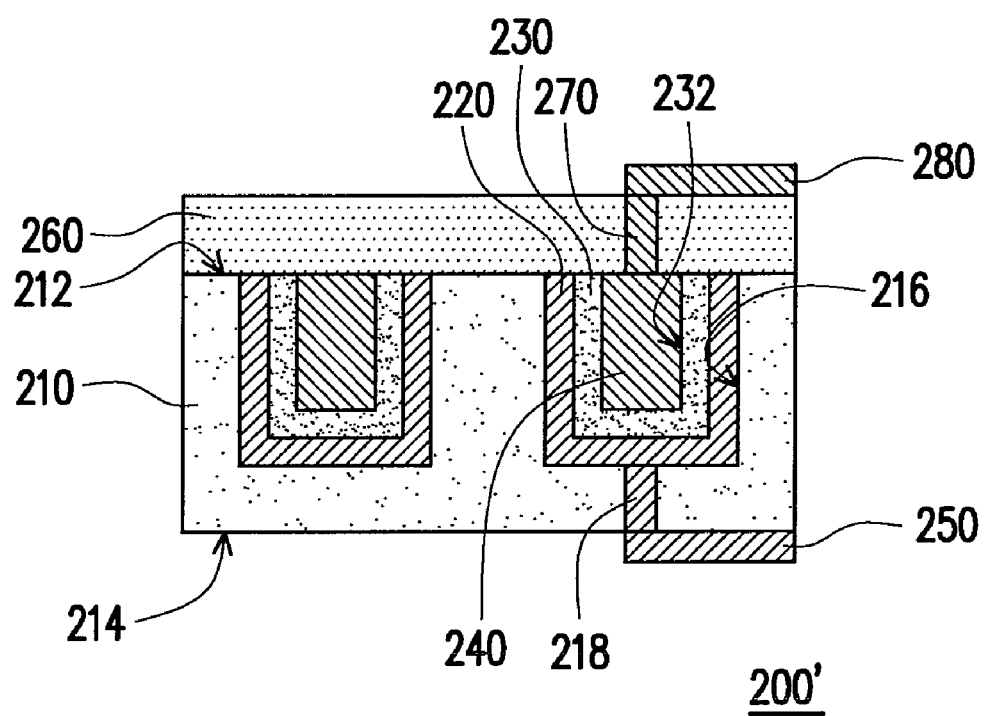

From another point of view, in other embodiments, after forming a second circuit layer 240 in the second dielectric layer 230 (as shown in FIG. 2F), the method further includes the following steps. First, as shown in FIG. 3A, a first conductive hole 218 is formed in the first dielectric layer 210, and the first conductive hole 218 is connected with the first circuit layer 220. Then, as shown in FIG. 3B, a first connection circuit 250 is formed on the second surface 214 of the first dielectric layer 210, and the first connection circuit 250 is connected with the first conductive hole 218. After that, as shown in FIG. 3C, a third dielectric layer 260 is formed on the first surface 212 of the first dielectric layer 210. Thereafter, as shown in FIG. 3D, a second conductive hole 270 is formed in the third dielectric layer 260, and the second conductive hole 270 is connected with the second circuit layer 240. Then, as shown in FIG. 3E, a second connection circuit 280 is formed on the third dielectric layer 260, and the second connection circuit 280 is connected with the second conductive hole 270. Hence, the manufacturing of the circuit board 200' of another embodiment of the present invention is done. The first connection circuit 250 and the second connection circuit 280 are, for example, defined on the surface of the first dielectric layer 210 by a photolithographic process. The first conductive hole 218 and the second conductive hole 270 are, for example, fabricated by electroplating or in other appropriate manner.

In view of the above, the second circuit layer of the present invention is, for example, a main circuit for transmitting electrical signals, and the first circuit layer is, for example, the shielding circuit of the second circuit layer. Therefore, when electrical signals propagate on, for example, the second circuit layer of the main circuit, the generated electromagnetic wave may be isolated by, for example, the first circuit layer of the shielding circuit, and will not influence other main circuits. In other words, the circuit board of the present invention may effectively solve the problem of electromagnetic interference between any two main circuits, and thus the main circuits have good signal transmission quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board, comprising:
a first dielectric layer, comprising a first surface and a second surface opposite to the first surface, wherein at least one first trench is embedded into the first dielectric layer from the first surface, and the at least one first trench does not reach the second surface;
a first circuit layer, formed on an inside wall of the first trench;
a second dielectric layer, disposed in the first trench, and covering the first circuit layer; and
a second circuit layer, disposed in the first trench and exposed from the first surface of the first dielectric layer, wherein the second dielectric layer is located between the first circuit layer and the second circuit layer, and a top surface of the first circuit layer and a top surface of the second circuit layer are substantially coplanar with the first surface of the first dielectric layer.

2. The circuit board according to claim 1, further comprising:
- a first connection circuit, disposed on the second surface of the first dielectric layer;
- a first conductive hole, embedded in the first dielectric layer to connect the first connection circuit to the first circuit layer;
- a third dielectric layer, covering the first surface and the trench of the first dielectric layer;
- a second connection circuit, disposed on the third dielectric layer; and
- a second conductive hole, embedded in the third dielectric layer to connect the second connection circuit to the second circuit layer.

3. The circuit board according to claim 1, wherein a material of the second dielectric layer is a high dielectric constant material.

* * * * *